(12) United States Patent
Hori et al.

(10) Patent No.: US 9,999,146 B2
(45) Date of Patent: Jun. 12, 2018

(54) SEMICONDUCTOR MODULE (71) Applicant: FUJI ELECTRIC CO., LTD., Kawasaki-shi, Kanagawa (JP)

(72) Inventors: Motohito Hori, Matsumoto (JP); Yoshinari Ikeda, Matsumoto (JP); Hideyo Nakamura, Matsumoto (JP); Eiji Mochizuki, Matsumoto (JP); Tatsuo Nishizawa, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days. days.

(21) Appl. No.: 15/335,916

(22) Filed: Oct. 27, 2016

(65) Prior Publication Data
US 2017/0181300 A1 Jun. 22, 2017

(30) Foreign Application Priority Data
Dec. 17, 2015 (JP) .................. 2015-246022

(51) Int. Cl.
| H05K 7/00 | (2006.01) |
| H05K 5/02 | (2006.01) |
| H01L 23/50 | (2006.01) |
| H01L 23/538 | (2006.01) |
| H01L 25/065 | (2006.01) |
| H01L 25/11 | (2006.01) |
| H01L 25/18 | (2006.01) |
| H05K 5/00 | (2006.01) |
| H05K 7/14 | (2006.01) |

(52) U.S. Cl.
CPC .......... *H05K 5/0256* (2013.01); *H01L 23/50* (2013.01); *H01L 23/5385* (2013.01); *H01L 23/5389* (2013.01); *H01L 25/0655* (2013.01); *H01L 25/115* (2013.01); *H01L 25/18* (2013.01); *H05K 5/0021* (2013.01); *H05K 5/0204* (2013.01); *H05K 5/0247* (2013.01); *H05K 7/1432* (2013.01)

(58) Field of Classification Search
CPC .. H05K 5/0256; H05K 5/0021; H05K 5/0204; H05K 5/0247; H05K 7/1432; H01L 23/50; H01L 23/5385; H01L 23/5389; H01L 25/0655; H01L 25/115; H01L 25/18
USPC .................................. 361/728–730
See application file for complete search history.

(56) References Cited

U.S. PATENT DOCUMENTS

| 9,504,154 B2* | 11/2016 | Tada ..................... H05K 1/0263 |
| 9,660,356 B1* | 5/2017 | Nakamura ........ H01L 23/49811 |
| 2012/0241953 A1* | 9/2012 | Yamada .............. H01L 23/4334 257/737 |

(Continued)

FOREIGN PATENT DOCUMENTS

| JP | 2009-060746 A | 3/2009 |
| WO | WO-2014/174854 A1 | 10/2014 |

*Primary Examiner* — Hung S Bui
(74) *Attorney, Agent, or Firm* — Rabin & Berdo, P.C.

(57) ABSTRACT

A semiconductor module includes sealing resin from which a main terminal protrudes, which seals an insulating substrate. The module includes a semiconductor element and a wiring substrate. The sealing resin has a nut housing portion in which a nut is disposed. The semiconductor module also has a busbar terminal to which a main terminal that protrudes from the sealing resin is electrically connected and which has an insertion hole facing the nut.

13 Claims, 5 Drawing Sheets (56) References Cited

U.S. PATENT DOCUMENTS

| | | | |
|---|---|---|---|
| 2014/0347836 A1* | 11/2014 | Nakamura | H01L 23/3121 |
| | | | 361/764 |
| 2014/0367736 A1* | 12/2014 | Iizuka | H01L 25/072 |
| | | | 257/133 |
| 2015/0380338 A1 | 12/2015 | Hori et al. | |
| 2017/0018524 A1* | 1/2017 | Nashida | H01L 24/29 |

* cited by examiner

SEMICONDUCTOR MODULE

CROSS-REFERENCE TO RELATED APPLICATION

This application is based upon and claims the benefit of priority of the prior Japanese Patent Application No. 2015-246022, filed on Dec. 17, 2015, the entire contents of which are incorporated herein by reference.

BACKGROUND OF THE INVENTION

1. Field of the Invention

The embodiments discussed herein are related to a semiconductor module.

2. Background of the Related Art

A semiconductor module includes a plurality of power semiconductor elements and is used as a power converting device or a switching device. As one example, it is possible to configure a semiconductor device that functions as a switching device by connecting a plurality of semiconductor elements, including IGBT (Insulated Gate Bipolar Transistors), MOSFET (Metal Oxide Semiconductor Field Effect Transistors), and the like in parallel.

One specific example is a semiconductor device where a plurality of insulating substrates, which each include an insulating board that has copper foil formed on both the front and rear surfaces thereof and have semiconductor elements disposed on the copper foil on the front surface, are sealed in resin (see, for example, Japanese Laid-open Patent Publication No. 2009-60746).

By connecting a plurality of semiconductor devices, it is possible to obtain a larger output.

For configurations where a plurality of semiconductor modules are connected, it is desirable to make it easy to connect the semiconductor modules together.

SUMMARY OF THE INVENTION

In one aspect of the embodiments, there is provided a semiconductor module including: an insulating substrate with an insulating board and a metal plate formed on a front surface of the insulating board; a semiconductor element whose rear surface is fixed to the metal plate and has a main electrode on a front surface thereof; a wiring substrate that is electrically connected to the main electrode of the semiconductor element; a main terminal that is electrically connected via the wiring substrate to the main electrode; a sealing member from which the main terminal protrudes, which seals the insulating substrate, the semiconductor element, and the wiring substrate, and has an opening hole in a periphery of the main terminal; a nut disposed in the opening hole; and a connecting terminal to which the main terminal is electrically connected and which has an insertion hole facing the nut.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Several embodiments will be described below with reference to accompanying drawings, wherein like reference numerals refer to like elements throughout.

Note that the embodiments described below do not limit the invention as defined in the patent claims. The features described in the embodiments should also not be construed as all being configurations that are essential for the invention.

First Embodiment

A semiconductor module according to a first embodiment will now be described with reference to FIGS. 1A, 1B, and 2.

Figure 1A:
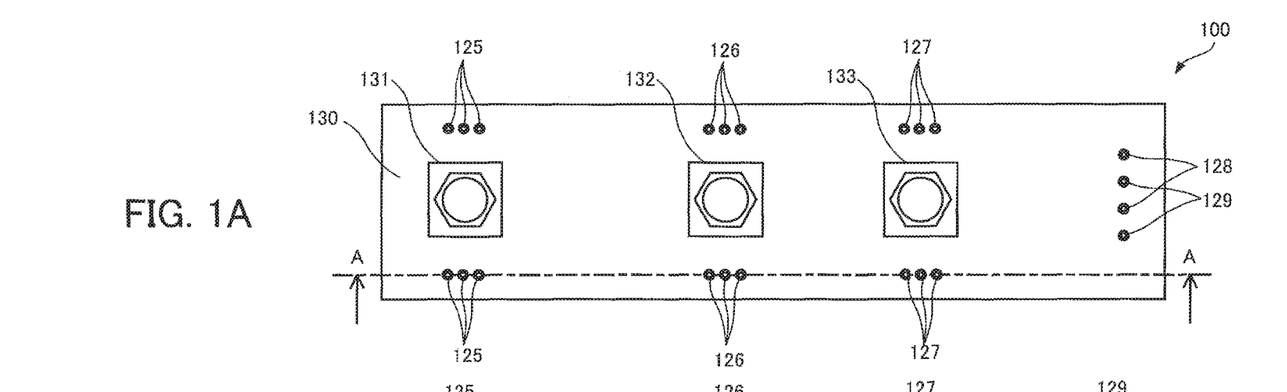
FIGS. 1A and 1B depict a semiconductor module according to the first embodiment.
Figure 1B:
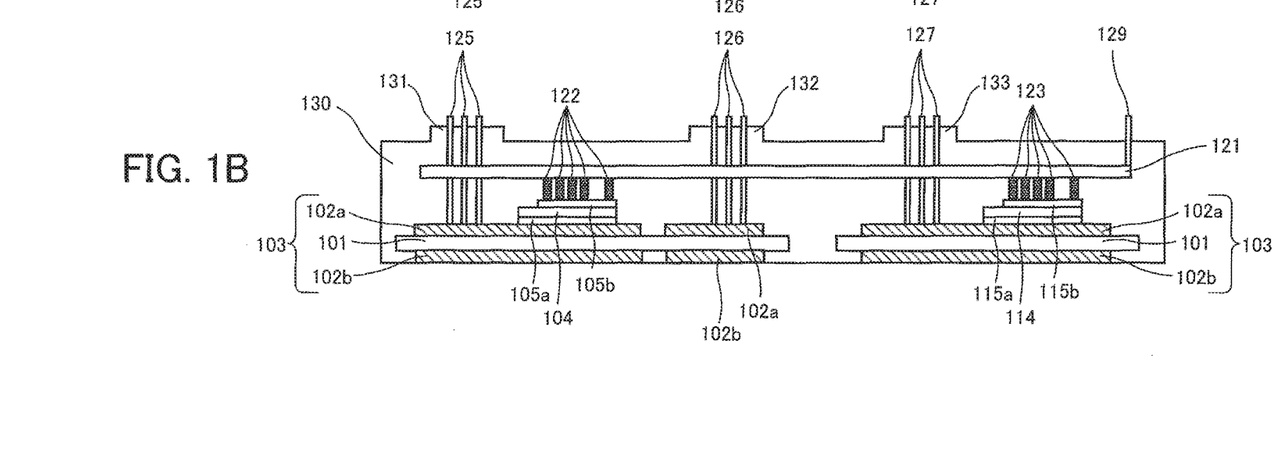

FIGS. 1A and 1B depict a semiconductor module according to the first embodiment.

Here, FIG. 1A is a plan view of a semiconductor module 100 and FIG. 1B is a cross-sectional view of the semiconductor module 100 along a dot-dash line A-A in FIG. 1A.

Figure 2:
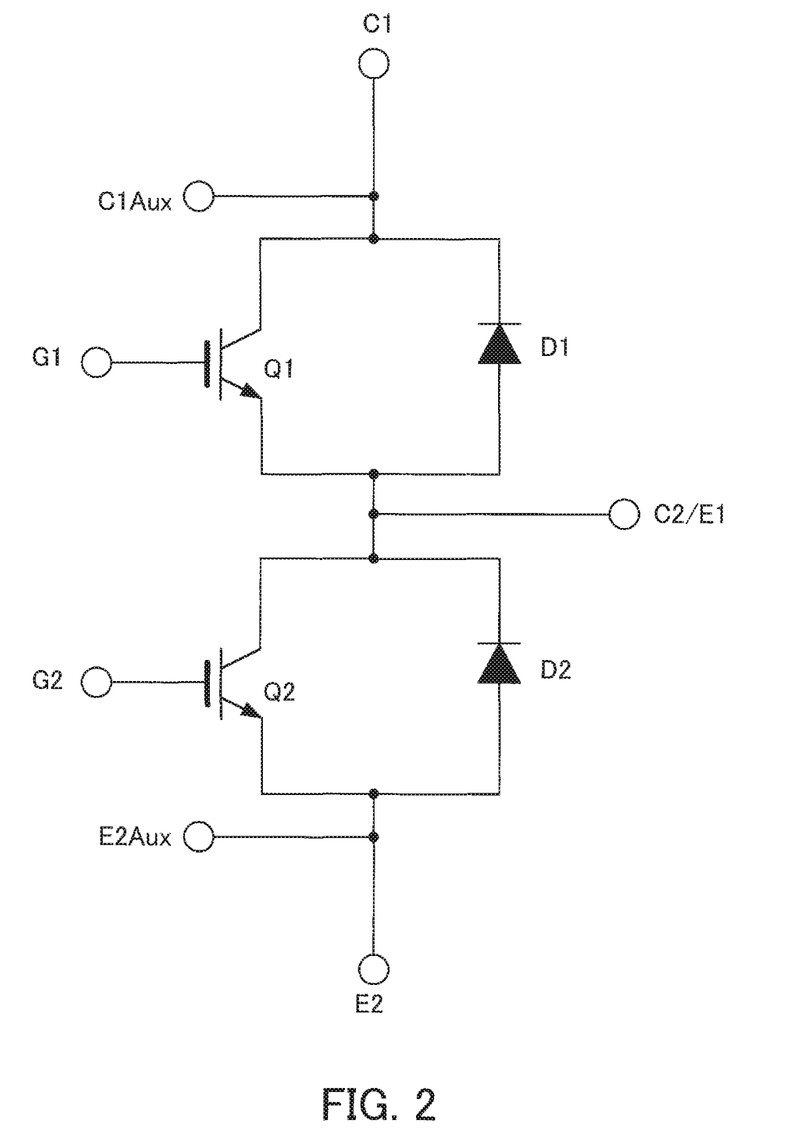
FIG. 2 is an equivalent circuit diagram depicting a circuit configuration of the semiconductor module according to the first embodiment.

FIG. 2 is an equivalent circuit diagram depicting a circuit configuration of the semiconductor module according to the first embodiment.

The semiconductor module 100 includes two semiconductor circuits configured by mounting semiconductor elements 104 and 114 on insulating substrates 103 via solder 105a and 115a, and a wiring substrate 121 that makes up a common wiring circuit disposed above the semiconductor circuits. Note that the semiconductor elements 104 and 114 and the wiring substrate 121 are electrically connected by conductive posts 122 and 123. The conductive posts 122 and 123 are electrically connected to the semiconductor elements 104 and 114 via solder 105b and 115b. In these semiconductor circuits, the semiconductor elements 104 and 114 are constructed by IGBT or power devices such as power MOSFETs and FWD. Note that in FIGS. 1A and 1B, only one semiconductor element 104 or 114 is depicted on one insulating substrate 103. In reality, switching devices, such as IGBT, and FWD are disposed on metal plates 102a on the front surface of the insulating substrate 103 and are connected as depicted in the equivalent circuit in FIG. 2.

Note that the semiconductor elements 104 and 114 may be formed on a silicon substrate or may be formed on a silicon carbide substrate.

The insulating substrate 103 includes an insulating board 101 made of a ceramic with favorable heat resistance, such as alumina, and metal plates 102a and 102b that make up conductive layers and are stuck onto front and rear surfaces of the insulating board 101. Predetermined circuit patterns for connecting a plurality of power devices disposed on the conductive layer on the front surface (i.e., the metal plates 102a) are formed on the conductive layer on the front surface.

As depicted in FIG. 2, an antiparallel circuit composed of a switching device (hereinafter simply "transistor") Q1 and an FWD (hereinafter simply "diode") D1 and an antiparallel circuit composed of a transistor Q2 and a diode D2 are connected in series on the metal plates 102a of the insulating substrate 103.

Here, a semiconductor element (power device) disposed on one insulating substrate 103 may be constructed as the equivalent of the antiparallel circuit including the transistor and the diode depicted in FIG. 2. This means it is possible for one or both of the transistor and diode to be a plurality of semiconductor elements of the same rating.

FIGS. 1A and 1B depict a state where the semiconductor element 104 that makes up the transistor Q1 and a semiconductor element (not illustrated) that makes up the diode D1 behind the semiconductor element 104 are laid out in the front-rear direction on a metal plate 102a on the insulating substrate 103. In the same way, on a metal plate 102a on another insulating substrate 103, the semiconductor element 114 that makes up the transistor Q2 and a semiconductor element that makes up the diode D2 behind the semiconductor element 104 are disposed in the front-rear direction. That is, the transistor Q1 and the diode D1 on the insulating substrate 103 and the transistor Q2 and the diode D2 on the other insulating substrate 103 are respectively connected in antiparallel by the metal plates 102a on the insulating substrates 103 and the wiring substrate 121. Also, the two antiparallel circuits composed of the pair of transistors Q1 and Q2 and the pair of diodes D1 and D2 are connected in series via the wiring substrate 121 disposed above these elements and the conductive posts 122 and 123 that are cylindrical.

Note that the collector electrode of the transistor Q1 is formed on a lower surface of one semiconductor element 104 and is connected via the metal plate 102a to main terminals 127 that make up an external input terminal (collector terminal C1) of the semiconductor module 100. The collector electrode of the transistor Q2 formed on the rear surface of the other semiconductor element 114 is also connected via a metal plate 102a to main terminals 125 that make up an external input terminal (collector/emitter terminal C2/E1). The emitter electrode and gate electrode are formed on the front surfaces of the semiconductor elements 104 and 114 and are connected via the conductive posts 122 and 123 respectively to the wiring substrate 121. Out of these, the emitter electrode of the semiconductor element 104 (the transistor Q1) is connected via the wiring substrate 121 to the main terminals 125 and the emitter electrode of the semiconductor element 114 (the transistor Q2) is connected via the wiring substrate 121 to main terminals 126 that make up an external input terminal (emitter terminal E2).

A total of eighteen of these main terminals 125 to 127 are formed in groups of three at positions that are symmetrical about a center axis of the semiconductor module 100 as depicted in FIG. 1A. The semiconductor module 100 further includes two control terminals 128 and two emitter signal terminals 129. The control terminals 128 are connected to the wiring substrate 121 and make up gate terminals G1 and G2 that supply gate control signals to the gate electrodes of the transistors Q1 and Q2 of a half-bridge circuit. The emitter signal terminals 129 are auxiliary terminals and make up test terminals C1Aux, E2Aux or the like that output sensing signals used to sense the currents flowing between the collector and emitter of each transistor.

The various component elements of the semiconductor module 100 are molded and protected by sealing resin 130 that is composed for example of a thermosetting epoxy resin material. As a result, the semiconductor module 100 has the overall external form of a rectangular solid and is rectangular when viewed from above. End portions of the eighteen main terminals 125 to 127, the control terminals 128, and the emitter signal terminals 129 protrude from the upper surface of the semiconductor module 100. At the base surface of the semiconductor module 100, the metal plates 102b on the base surface sides of the insulating substrates 103 are disposed so as to be flush. Nut housing portions 131, 132, and 133 that house nuts (described later) are formed as protrusions on an upper surface of the semiconductor module 100.

Note that although the collector/emitter terminal C2/E1, the emitter terminal E2, and the collector terminal C1 are respectively associated with the main terminals 125 to 127 in the example described above, the present embodiment is not limited to this. The collector terminal C1, the collector/emitter terminal C2/E1, and the emitter terminal E2 may be freely associated with the main terminals 125 to 127 in keeping with the metal plates 102a of the insulating substrates 103 and the wiring of the wiring substrate 121.

Next, a configuration where busbar terminals (connection terminals) 140 are attached to the main terminals 125 to 127 of this semiconductor module 100 will be described with reference to FIGS. 3A to 3C.

Figure 3A:
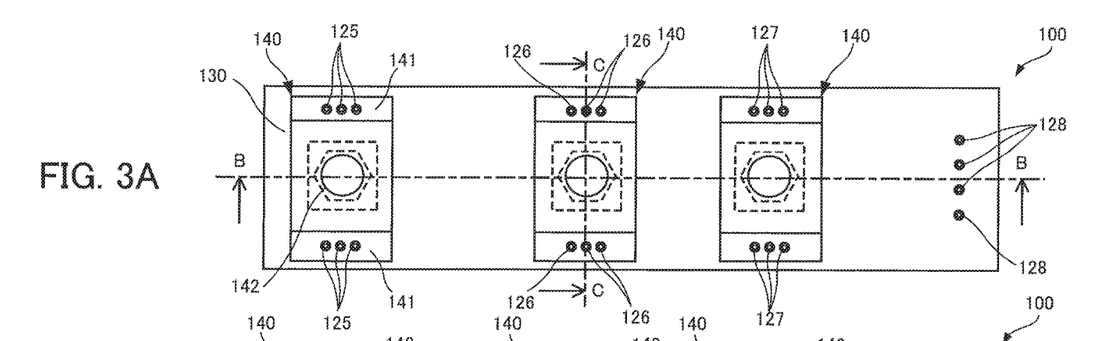
FIGS. 3A to 3C depict a (busbar terminal-equipped) semiconductor module according to the first embodiment.
Figure 3B:
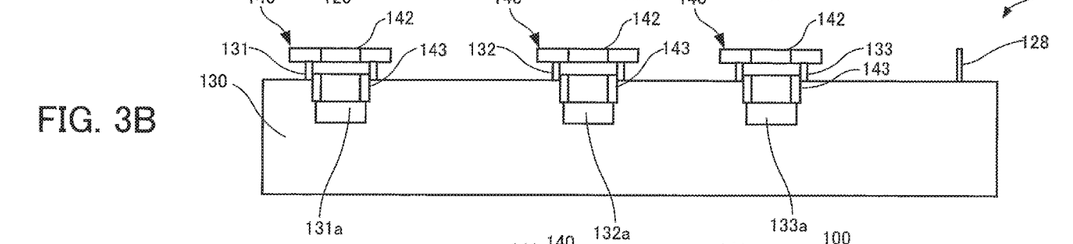
Figure 3C:
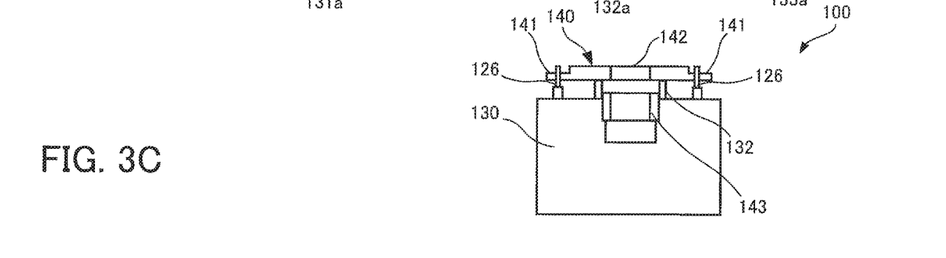

FIGS. 3A to 3C depict a (busbar terminal-equipped) semiconductor module according to the first embodiment.

Note that FIG. 3A is a plan view of the semiconductor module 100 to which the busbar terminals 140 have been attached. FIG. 3B is a cross-sectional view of the semiconductor module 100 taken along a dot-dash line B-B in FIG. 3A and FIG. 3C is a cross-sectional view of the semiconductor module 100 taken along a dot-dash line C-C in FIG. 3A.

The busbar terminals 140 respectively attached to the main terminals 125 to 127 of the semiconductor module 100 are in the form of rectangular plates, have stepped portions 141 provided at both ends in the length direction, and each have an insertion hole 142 formed in a center portion.

The busbar terminals 140 have the front end portions of the main terminals 125 to 127 attached to the stepped portions 141, with the main terminals 125 to 127 being joined to the stepped portions 141 by laser welding, soldering, or the like. When doing so, the front end portions of the main terminals 125 to 127 are joined to the stepped portions 141 of the busbar terminals 140 so as to protrude within a range that does not exceed the height of the stepped portions 141. That is, the front end portions of the main terminals 125 to 127 do not protrude beyond the upper surfaces of the busbar terminals 140. In particular, it is preferable for the thickness of the stepped portions 141 to be in a range of 0.5 mm to 2 mm. This means that when the semiconductor modules 100 are stacked or when articles are disposed on the semiconductor modules 100, it is possible to stack and dispose articles appropriately. Since it is also possible for the busbar terminals 140 to locally deform at the stepped portions 141, when a tensile force is applied to a busbar terminal 140, the tensile force applied to the main terminals 125 to 127 is reduced.

The nut housing portions 131, 132, and 133 that house the nuts 143 are provided between the main terminals 125, 126, and 127 on a center axis (the dot-dash line B-B) on the sealing resin 130 of the semiconductor module 100. As depicted in the drawings, the nut housing portions 131, 132, and 133 protrude from the upper surface of the sealing resin 130 of the semiconductor module 100 and have opening holes 131a, 132a, and 133a in which the nuts 143 are housed formed therein.

The busbar terminals 140 are supported on their rear surface sides by the nut housing portions 131, 132, and 133. By doing so, it is possible to lift the busbar terminals 140, which makes it easy to join the stepped portions 141 of the busbar terminals 140 and the main terminals 125 to 127.

In addition, the insertion holes 142 of the busbar terminals 140 that have been attached to the main terminals 125, 126, and 127 in this way are aligned with the opening holes 131a, 132a, and 133a of the nut housing portions 131, 132, and 133.

Next, a configuration where two semiconductor modules 100 with attached busbar terminals 140 are joined will be described with reference to FIG. 4.

Figure 4:
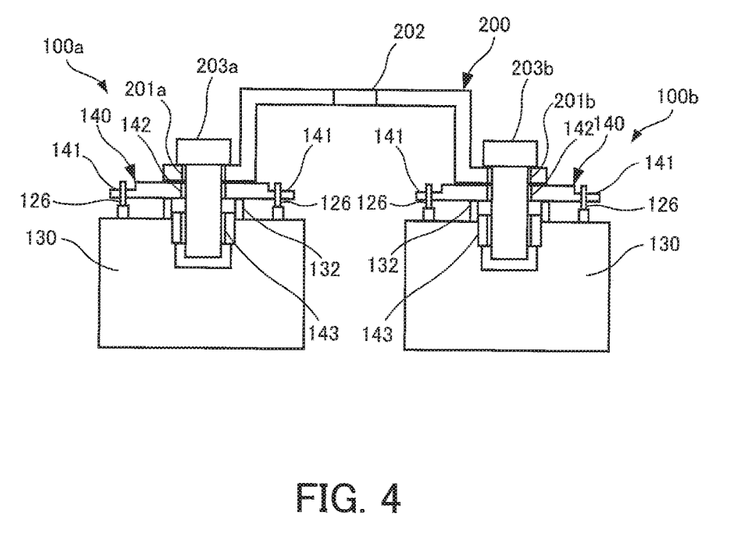
FIG. 4 depicts a configuration where two semiconductor modules according to the first embodiment are connected.

FIG. 4 depicts a configuration where two semiconductor modules according to the first embodiment are connected.

Note that in the same way as FIG. 3C, FIG. 4 is a cross-sectional view of two semiconductor modules 100 that have been connected using a connecting busbar.

In FIG. 4, the semiconductor modules 100 are indicated as the semiconductor module 100a on the left in the drawing and the semiconductor module 100b on the right. Here, the semiconductor modules 100a and 100b have the same configurations as the semiconductor module 100.

At the semiconductor module 100a (on the left in the drawing), a connecting hole 201a of the connecting busbar 200, the insertion hole 142 of the busbar terminal 140, and the nut 143 housed in the semiconductor module 100a are aligned. In addition, a bolt 203a is inserted through the connecting hole 201a and the insertion hole 142 and fitted into the nut 143. While an embodiment is described in which a nut 143 is provided, embodiments of the invention encompass any fixing member or fixing mechanism capable of being secured in a housing, such as the nut housing 131, 132, or 133, and receiving and securing a connection device, such as a bolt, a pin (which may include ridges, teeth, bearings, etc.), a latch member, or any other fixing protrusion or device. Embodiments encompass removable connection devices, defined as connection devices that may be removed without breaking the fixing member or the connection device, including screws, bolts, and pins.

In the same way, at the semiconductor module 100b also (on the right in FIG. 4), a connecting hole 201b of the connecting busbar 200, the insertion hole 142 of the busbar terminal 140, and the nut 143 housed in the semiconductor module 100a are aligned. In addition, a bolt 203b is inserted through the connecting hole 201b and the insertion hole 142 and fitted into the nut 143.

In this way, it is possible to electrically connect two semiconductor modules 100a and 100b using the connecting busbar 200. By connecting a connecting hole 202 of the connecting busbar 200 to an external terminal, it becomes possible to input and output to and from the two semiconductor modules 100a and 100b.

In this way, the semiconductor modules 100, 100a, and 100b described above include the insulating substrates 103, which each have an insulating board 101 and a metal plate 102a formed on the front surface of the insulating board 101, the semiconductor elements 104 and 114 whose rear surfaces are fixed onto a metal plate 102a and have main electrodes on their front surfaces, the wiring substrate 121 that is electrically connected to the main electrodes of the semiconductor elements 104 and 114, and the main terminals 125 to 127 that are electrically connected via the wiring substrate 121 to the main electrodes of the semiconductor elements 104 and 114. The semiconductor modules 100, 100a, and 100b also have the sealing resin 130, which seals the insulating substrates 103, the semiconductor elements 104 and 114, and the wiring substrate 121 with the main terminals 125 to 127 protruding and includes the nut housing portions 131, 132, and 133 and the nuts 143 disposed in the nut housing portions 131, 132, and 133. In addition, the semiconductor module 100 has the busbar terminal 140 that is electrically connected to the main terminals 125 to 127 protruding from the sealing resin 130 and has the insertion holes 142 corresponding to the nuts 143. With this configuration, by merely connecting the busbar terminals 140 of the semiconductor modules 100, 100a, and 100b using the connecting busbar 200, it becomes possible to easily connect two of the semiconductor modules 100, 100a, and 100b.

Second Embodiment

In the second embodiment, a configuration where the height of the nuts disposed in the semiconductor module 100 is different to the first embodiment will be described with reference to FIG. 5.

Figure 5:
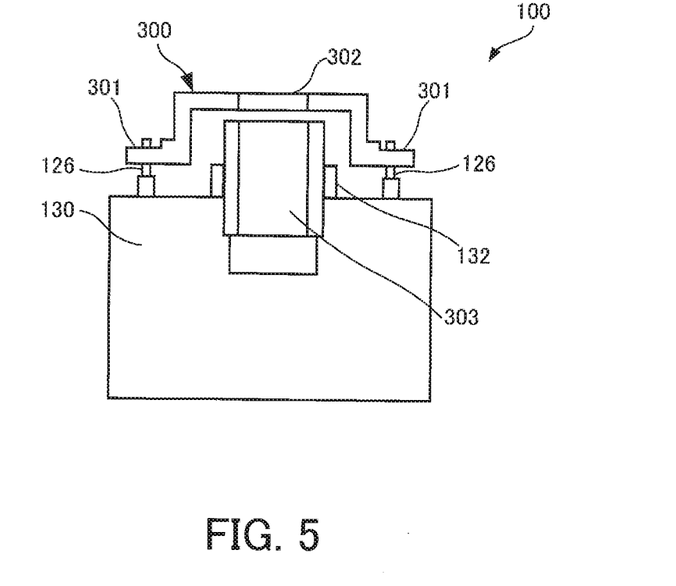
FIG. 5 depicts a (busbar terminal-equipped) semiconductor module according to the second embodiment.

FIG. 5 depicts a (busbar terminal-equipped) semiconductor module according to the second embodiment.

Note that FIG. 5 corresponds to a cross section along the dot-dash line C-C in FIG. 3A for the semiconductor module according to the second embodiment.

The semiconductor module 100 according to the second embodiment depicted in FIG. 5 has the same configuration as the semiconductor module 100 according to the first embodiment depicted in FIGS. 1A and 1B. However, the height of nuts 303 is greater than the height of the nuts 143 in the first embodiment.

In keeping with the height of the nuts 303, a busbar terminal 300 attached to the main terminals 126 of the semiconductor module 100 in FIG. 5 is configured so that a center portion protrudes upward so as to be located at a high position, and an insertion hole 302 provided in the center portion of the busbar terminal 300 is aligned with the nut 303.

With the semiconductor module 100 according to the second embodiment, in keeping with the height of the nut 303, the height of the center portion of the busbar terminal 300 where the insertion hole 302 is formed is changed, with a busbar terminal 300 that matches the height of the nut 303 being selected. By doing so, when a plurality of semiconductor modules 100 have different heights due to differences in type, for example, by selecting nuts 303 and busbar terminals 300 of various heights, it becomes possible to electrically connect the semiconductor modules 100 at the same height.

According to the present embodiments, it is possible to connect semiconductor modules and obtain a larger output.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:
1. A semiconductor module comprising:
an insulating substrate with an insulating board and a metal plate formed on a front surface of the insulating board;

a semiconductor element having a rear surface fixed to the metal plate and having a main electrode on a front surface thereof;

a wiring substrate that is electrically connected to the main electrode of the semiconductor element;

a main terminal that is electrically connected via the wiring substrate to the main electrode;

a sealing member from which the main terminal protrudes, which seals the insulating substrate, the semiconductor element, and the wiring substrate, and has an opening hole in a periphery of the main terminal;

a nut disposed in the opening hole; and a connecting terminal to which the main terminal is electrically connected and which has an insertion hole facing the nut.

2. The semiconductor module according to claim 1, wherein the sealing member has a protruding portion at a position corresponding to the opening hole, and the connecting terminal is supported by the protruding portion.

3. The semiconductor module according to claim 1, wherein the nut and the insertion hole are aligned.

4. The semiconductor module according to claim 1, wherein a stepped portion is formed in the connecting terminal at a part connected to the main terminal.

5. The semiconductor module according to claim 1, wherein a height of a part of the connection terminal where the insertion hole is formed corresponds to a height of the nut.

6. A semiconductor module comprising:

an insulating substrate;

a semiconductor element mounted to the insulating substrate;

a wiring substrate electrically connected to an electrode of the semiconductor element;

a main terminal electrically connected via the wiring substrate to the electrode;

a sealing member which fills spaces between, and at least partially surrounds, the insulating substrate, the semiconductor element, and the wiring substrate, and has an opening hole in a first surface of the sealing member;

a fixing member disposed in the opening hole; and a connecting terminal electrically connected to the main terminal and having a hole located over the fixing member corresponding to a receiving opening in the fixing member, wherein the fixing member is located between the connecting terminal and a bottom of the opening hole in the sealing member, in a depth direction from the first surface of the sealing member, such that a connecting device inserted through the hole in the connecting terminal is connectable to the fixing member in the opening hole of the sealing member.

7. The semiconductor module according to claim 6, wherein the wiring substrate is located on an opposite side of the semiconductor element from the insulating substrate, and separated from a surface of the semiconductor element by at least one conductive post.

8. The semiconductor module according to claim 6, wherein at least a portion of the fixing member protrudes from the opening hole in the sealing member.

9. The semiconductor module according to claim 6, wherein the sealing member, the fixing member, and the connecting terminal are arranged such that the connecting device inserted through the hole in the connecting terminal and inserted into the receiving opening in the fixing member fixes the connecting terminal to the sealing member.

10. The semiconductor module according to claim 6, wherein the connecting terminal includes a step at a location of the connecting terminal connected to the main terminal, such that a thickness of the connecting terminal is thinner at a first section including the location connected to the main terminal than a second section corresponding to the hole in the connecting terminal.

11. The semiconductor module according to claim 6, wherein a first portion of the connecting terminal corresponding to a location where the connecting terminal connects to the main terminal is closer to a surface of the sealing member than a second portion of the connecting terminal located over the fixing member.

12. The semiconductor module according to claim 11, wherein a top surface of the fixing member is located farther from the surface of the sealing member than a top surface of the first portion of the connecting terminal.

13. A semiconductor module system, comprising:

first and second semiconductor modules, each of the first and second semiconductor modules comprising:

an insulating substrate;

a semiconductor element mounted to the insulating substrate;

a wiring substrate electrically connected to an electrode of the semiconductor element;

a main terminal electrically connected via the wiring substrate to the electrode;

a sealing member which fills spaces between, and at least partially surrounds, the insulating substrate, the semiconductor element, and the wiring substrate, and has an opening hole in a first surface of the sealing member;

a fixing member disposed in the opening hole; and a connecting terminal electrically connected to the main terminal and having a hole located over the fixing member corresponding to a receiving opening in the fixing member;

a busbar having a first opening located over the hole of the connecting terminal of the first semiconductor module and a second opening located over the hole of the connecting terminal of the second semiconductor module;

a first bolt fixing the busbar to the first semiconductor module by passing through first opening of the busbar and the hole of the first semiconductor module to connect to the fixing member of the first semiconductor module; and a second bolt fixing the busbar to the second semiconductor module by passing through second opening of the busbar and the hole of the second semiconductor module to connect to the fixing member of the second semiconductor module.

* * * * *